(12) United States Patent
Kumbhat et al.

(10) Patent No.: US 10,163,808 B2
(45) Date of Patent: *Dec. 25, 2018

(54) MODULE WITH EMBEDDED SIDE SHIELD STRUCTURES AND METHOD OF FABRICATING THE SAME

(71) Applicant: Avago Technologies General IP (Singapore) Pte. Ltd., Singapore (SG)

(72) Inventors: Nitesh Kumbhat, San Jose, CA (US); Deog Soon Choi, Seoul (KR); Wei-Shun Wang, Palo Alto, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/920,817

(22) Filed: Oct. 22, 2015

(65) Prior Publication Data

US 2017/0118875 A1 Apr. 27, 2017

(51) Int. Cl.
*H01L 23/552* (2006.01)
*H05K 9/00* (2006.01)

(52) U.S. Cl.
CPC ......... *H01L 23/552* (2013.01); *H05K 9/0022* (2013.01); *H05K 9/0024* (2013.01); *H05K 9/0081* (2013.01)

(58) Field of Classification Search
CPC ...... H05K 9/0022; H05K 1/181; H05K 1/111; H05K 3/0014; H05K 1/0216; H05K 3/30; H05K 3/101; H05K 1/0215; H05K 2201/0707; H05K 2201/10371; H05K 9/0024; H05K 9/0081; H05K 9/0007

USPC ........ 361/761, 799, 800, 816, 818; 257/659, 257/660, 786, 787
See application file for complete search history.

(56) References Cited

U.S. PATENT DOCUMENTS

| 5,838,551 A | 11/1998 | Chan |
| 6,350,951 B1 | 2/2002 | Askew |
| 6,552,261 B2 | 8/2003 | Shlahtichman et al. |

(Continued)

OTHER PUBLICATIONS

"Noise Suppression Products/EMI Suppression Filters", Reasons for requiring EMI suppression filters (EMIFIL?) I Murata Manufacturing Co., Ltd., http://www.murata.com/enus/products/emc/emifil/knowhow/basic/chapter01p1, pp. 1-29.

(Continued)

*Primary Examiner* — Steven T Sawyer
*Assistant Examiner* — Sagar Shrestha (57) ABSTRACT

A module includes a circuit package and a top external shield layer. The circuit package includes multiple electronic components on a substrate; at least one side shield structure located at a corresponding at least one side edge region of the circuit package and electrically connected to ground, the at least one side shield structure being positioned on the substrate or on a pad on the substrate; and a molded compound disposed over the substrate, the electronic components, and the at least one side shield structure. The top external shield layer is disposed on a top outer surface of the circuit package and is electrically connected to ground. The at least one side shield structure and the top external shield layer provide an external shield of the module configured to protect the circuit package from external electromagnetic radiation and environmental stress.

10 Claims, 6 Drawing Sheets

(56) References Cited

U.S. PATENT DOCUMENTS

| | | | |
|---|---|---|---|
| 6,614,102 B1 | 9/2003 | Hoffman et al. | |
| 7,898,066 B1 * | 3/2011 | Scanlan | H01L 24/97 |
| | | | 257/422 |
| 8,012,868 B1 | 9/2011 | Naval et al. | |
| 8,071,431 B2 * | 12/2011 | Hoang | H01L 23/552 |
| | | | 257/660 |
| 8,199,518 B1 | 6/2012 | Chun et al. | |
| 8,748,287 B2 | 6/2014 | Barth et al. | |
| 8,897,019 B1 | 11/2014 | Shimamura et al. | |
| 8,948,712 B2 | 2/2015 | Chen et al. | |
| 9,025,301 B1 * | 5/2015 | Adlam | G06K 9/0002 |
| | | | 361/152 |
| 9,041,168 B2 | 5/2015 | Hoang et al. | |
| 9,202,747 B2 | 12/2015 | Chen et al. | |
| 9,295,157 B2 | 3/2016 | Chen et al. | |
| 9,508,658 B1 * | 11/2016 | Convert | H01L 23/552 |
| 2003/0153123 A1 | 8/2003 | Tsai et al. | |
| 2003/0218257 A1 | 11/2003 | Ishio et al. | |
| 2004/0029312 A1 * | 2/2004 | Knapp | H01L 23/3107 |
| | | | 438/106 |
| 2005/0067676 A1 * | 3/2005 | Mahadevan | H01L 21/561 |
| | | | 257/659 |
| 2007/0176281 A1 | 8/2007 | Kim et al. | |
| 2008/0014678 A1 * | 1/2008 | Howard | H01L 21/565 |
| | | | 438/106 |
| 2009/0000114 A1 * | 1/2009 | Rao | H01L 23/552 |
| | | | 29/832 |
| 2009/0067149 A1 | 3/2009 | Bogursky et al. | |
| 2009/0152688 A1 * | 6/2009 | Do | H01L 23/552 |
| | | | 257/659 |
| 2009/0184403 A1 | 7/2009 | Wang et al. | |
| 2010/0285636 A1 | 11/2010 | Chen | |
| 2011/0084378 A1 * | 4/2011 | Welch | H01L 21/56 |
| | | | 257/692 |
| 2011/0140262 A1 * | 6/2011 | Lee | H01L 23/4334 |
| | | | 257/692 |
| 2011/0175179 A1 | 7/2011 | Chiu et al. | |
| 2012/0025356 A1 | 2/2012 | Liao et al. | |
| 2012/0061816 A1 * | 3/2012 | Song | H01L 23/3128 |
| | | | 257/696 |
| 2012/0086108 A1 | 4/2012 | Wu | |
| 2012/0146178 A1 * | 6/2012 | Hoang | H01L 23/552 |
| | | | 257/528 |
| 2012/0235259 A1 | 9/2012 | Fang et al. | |
| 2012/0320558 A1 | 12/2012 | Foster et al. | |
| 2013/0082364 A1 | 4/2013 | Wang et al. | |
| 2013/0323408 A1 | 12/2013 | Read et al. | |
| 2013/0324069 A1 * | 12/2013 | Chen | H04B 1/44 |
| | | | 455/334 |
| 2014/0001471 A1 | 1/2014 | Li | |
| 2014/0016277 A1 * | 1/2014 | Chen | H05K 1/181 |
| | | | 361/728 |
| 2014/0085857 A1 | 3/2014 | Chen et al. | |
| 2014/0175621 A1 * | 6/2014 | Chen | H01L 21/56 |
| | | | 257/659 |
| 2014/0231972 A1 | 8/2014 | Hsu et al. | |
| 2014/0307394 A1 * | 10/2014 | Lobianco | H04B 1/3838 |
| | | | 361/728 |
| 2015/0043189 A1 | 2/2015 | Kitazaki et al. | |
| 2015/0070851 A1 | 3/2015 | Kitazaki et al. | |
| 2015/0187705 A1 | 7/2015 | Chung | |
| 2015/0255402 A1 | 9/2015 | Hoang et al. | |
| 2015/0271959 A1 | 9/2015 | Chen et al. | |
| 2016/0093576 A1 | 3/2016 | Chiu et al. | |
| 2016/0172309 A1 * | 6/2016 | Gong | H01L 24/97 |
| | | | 257/659 |
| 2016/0181206 A1 * | 6/2016 | Read | H01L 23/552 |
| | | | 343/873 |
| 2017/0025362 A1 * | 1/2017 | Nguyen | H01L 23/49 |
| 2017/0040266 A1 | 2/2017 | Lin et al. | |
| 2017/0117229 A1 | 4/2017 | Kumbhat et al. | |
| 2017/0118875 A1 | 4/2017 | Kumbhat et al. | |
| 2017/0118877 A1 | 4/2017 | Kumbhat et al. | |
| 2017/0179041 A1 | 6/2017 | Dias et al. | |
| 2017/0186726 A1 | 6/2017 | Tang et al. | |

OTHER PUBLICATIONS

Co-pending U.S. Appl. No. 14/920,798, filed Oct. 22, 2015.
Non-Final Office Action dated Aug. 24, 2017 for U.S. Appl. No. 14/920,798.
Non-Final Office Action dated Jun. 16, 2017 for U.S. Appl. No. 14/920,806.
Non-Final Office Action dated Aug. 25, 2017 for U.S. Appl. No. 14/920,812.
Final Office Action dated Dec. 11, 2017 for U.S. Appl. No. 14/920,806.
Notice of Allowance dated Mar. 26, 2018 for U.S. Appl. No. 14/920,812.
Final Office Action dated Dec. 12, 2011 for U.S. Appl. No. 14/920,806.
Notice of Allowance dated Jul. 20, 2018 for U.S. Appl. No. 14/920,812.

* cited by examiner

MODULE WITH EMBEDDED SIDE SHIELD STRUCTURES AND METHOD OF FABRICATING THE SAME

BACKGROUND

Small electronic components, including amplifiers, filters, transducers and the like, are employed in a number of devices, particularly in radio frequency (RF) wireless communications, for example. Various types of filters, for example, include acoustic filters, such as surface acoustic wave (SAW) resonator devices containing SAW resonators, and bulk acoustic wave (BAW) resonator devices containing thin film bulk acoustic resonators (FBARs) and solidly mounted resonators (SMRs), for example.

Conventionally, the electronic components are combined in circuit packages and covered with external shields to form discrete shielded packages, referred to as "modules." The external shields are generally shield layers that cover the top and side walls (coating five sides) of the circuit packages, and provide protection against externally generated electromagnetic radiation ("external electromagnetic radiation"), as well as and environmental stresses, such as temperature, humidity, and physical impact, for example (e.g., hermetic sealing). In order to provide protection against the external electromagnetic radiation, the external shields are formed of either electrically conductive material, typically metal or alloy, or a combination of electrically conductive and non-conductive material. The bottoms of the circuit packages are typically not shielded by the external shield layers, although the substrate itself, external connecting pins protruding from the substrate and/or various electronic components, transmission lines and other circuitry within the substrate generally may provide some external shielding from external electromagnetic radiation. The external shield layers together with the bottom shielding together provide a "global shield" for the module.

However, coating the top and side walls of the circuit package is costly, time consuming and overall inefficient, since applying the conductive material can be done only after singulation of the individual circuit packages. That is, electronic components of multiple circuit packages are formed in or on a single substrate (or wafer) and covered with a molded compound to provide corresponding multiple circuit packages. The single substrate is then separated (e.g., by sawing or laser ablation) into the separate circuit packages, each of which must then be individually coated by the conductive material on the top and side walls for external electromagnetic radiation shielding.

Accordingly, there is a need for a fabrication process, and a resulting shielded package or module that enables application of external electromagnetic radiation shielding prior to singulation of the circuit packages into individual modules, thus avoiding the step of having to individually coat the circuit packages with conductive material after separation.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements throughout the drawings and written description.

DETAILED DESCRIPTION

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree. The term "approximately" means to within an acceptable limit or amount to one of ordinary skill in the art. Relative terms, such as "above," "below," "top," "bottom," "upper" and "lower" may be used to describe the various elements" relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

Generally, in various representative embodiments, a circuit package is included in a module having an external shield, which includes a top external shield layer formed on a top outer surface of the circuit package and at least partially embedded side shield structures formed in the circuit package at corresponding side surfaces. The at least partially embedded side shield structures are formed prior to singulation of the circuit package from other circuit packages formed on the same substrate, thereby enabling a single application of the top external shield layer (to multiple circuit packages) prior to singulation. The circuit package includes electronic components on the substrate that are protected from external electromagnetic radiation by the external shield, which is electrically connected to ground, reducing or eliminating electromagnetic interference otherwise caused by outside source of electromagnetic energy. The external shield also protects other modules in the vicinity of the circuit package from being subjected to electromagnetic radiation generated by the circuit package.

Figure 1:
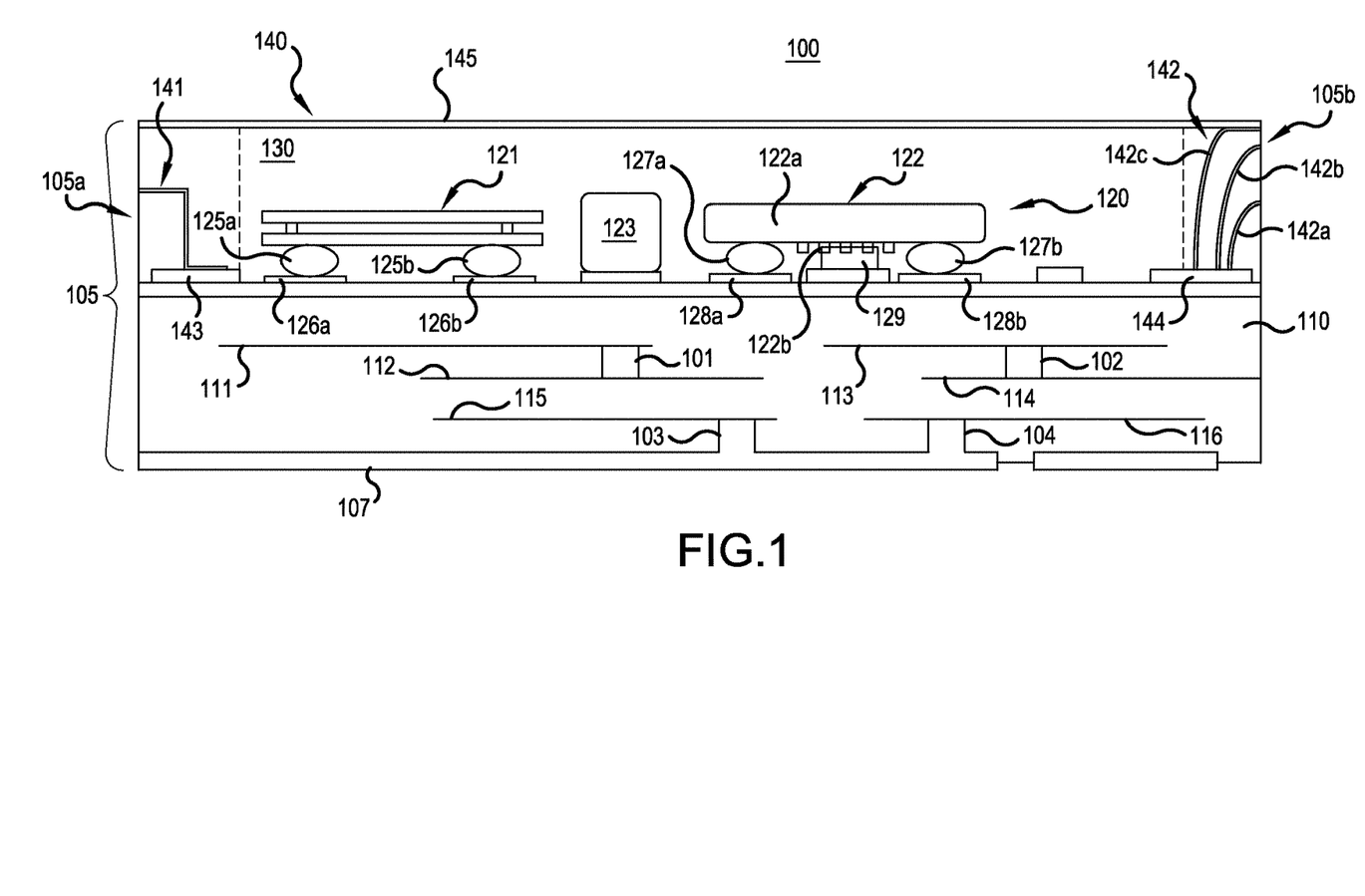
FIG. 1 is a simplified cross-sectional view of a module including internally formed side shield structures for providing external electromagnetic radiation shielding, without application of conductive material on side walls of the module, according to a representative embodiment.

FIG. 1 is a simplified cross-sectional view of a module including internally formed side shields for providing external electromagnetic radiation shielding, without application of conductive material on side walls of the module, according to a representative embodiment.

Referring to FIG. 1, module 100 includes a circuit package 105, which includes a substrate 110, multiple electronic components 120 assembled or formed on the substrate 110, a first side shield structure 141, a second side shield structure 142, and molded compound 130 disposed over the substrate 110, the electronic components 120, and the first and second side shield structures 141 and 142. Accordingly, the first and second side shield structures 141 and 142 are at least partially embedded the circuit package 105, and provide side external shields, respectively. That is, only exposed ends of the first and second side shield structures 141 and 142 are not surrounded by the molded compound 130. The module 100 further includes an external shield layer (or coating) 145 disposed on a top outer surface of the circuit package 105.

The first side shield structure 141, the second side shield structure 142, and the external shield layer 145 are connected to ground, respectively, to collectively provide an external shield 140 shielding all four sides and the top surface of the circuit package 105, such that the module 100 is a shielded module. (Because FIG. 1 is a cross-section, third and fourth side shield structures embedded at the front and back sides of the circuit package 105 in the depicted orientation are not shown.) That is, the first side shield structure 141, the second side shield structure 142, and the external shield layer 145 are configured to protect the circuit package 105 (and the electronic components 120 within the circuit package 105) from external electromagnetic radiation, environmental stress, and the like. In alternative configurations, the embedded side shield structures (e.g., the first and second side shield structures 141 and 142) may be located at fewer than all four sides of the circuit package 105, without departing from the scope of the present teachings. Also, the first and second side shield structures 141 and 142 become part of the external shield 140 after application of the molded compound 130 and the top external shield layer 145 to the substrate 110, which initially contains multiple circuit packages (including the circuit package 105) that are subsequently singulated to provide corresponding shielded modules (including module 100), as discussed below.

The substrate 110 may be formed of any material compatible with semiconductor processes, such as silicon (Si), gallium arsenide (GaAs), indium phosphide (InP), glass, sapphire, alumina, epoxy, bismaleimide triazine (BT), prepreg composites, reinforced or non-reinforced polymer dielectrics, and the like, for example. The substrate 110 includes embedded circuitry, indicated by representative traces 111, 112, 113, 114, 115 and 116, interconnected by representative vias 101, 102, 103 and 104. In the depicted embodiment, ground plane 107 is provided on a bottom surface of the substrate 110. Of course, alternative arrangements of traces, vias, terminals, ground planes and other electrical circuitry may be included in or on the substrate 110, to provide unique benefits for any particular situation or to meet application specific design requirements of various implementations, without departing from the scope of the present teachings.

In the depicted embodiment, representative electronic components 120 assembled or formed on the substrate 110 include, for purposes of illustration, an acoustic filter 121, a flipped chip integrated circuit (IC) 122, and a surface mounted technology (SMT) components 123. The acoustic filter 121 may be referred to as a first electronic component, the flipped chip IC 122 may be referred to as a second electronic component, and the SMT component 123 may be referred to as a third electronic component. For purposes of discussion, it may be assumed that some or all of the first through third electronic components produce varying amounts electromagnetic radiation, and also have varying levels of sensitivity to such electromagnetic radiation. Examples of the acoustic filter 121 include SAW resonator devices containing SAW resonators, and bulk acoustic wave (BAW) resonator devices containing FBARs and/or SMRs. Examples of the flipped chip IC 122 include power amplifiers, complementary metal-oxide semiconductor (CMOS) circuits and integrated silicon-on-insulator (SOI) circuits. Of course, the number and types of electronic components 120 are not limited, and thus may vary without departing from the scope of the present teachings.

As mentioned above, the molded compound 130 is disposed over the substrate 110, the electronic components 120 (e.g., the acoustic filter 121, the flipped chip IC 122, and the SMT component 123), and the first and second side shield structures 141 and 142. The molded compound 130 may be formed of a reinforced or non-reinforced epoxy resin, a polymer resin or a bisphenyl resin, for example, and may be applied using any process compatible with fabrication of semiconductor devices, such injection molding, transfer molding, or compression molding, for example. The molded compound 130 generally protects the electronic components 120 and provides additional structural support to the module 100. In various embodiments, the molded compound 130 may hermetically seal the electronic components 120 within the circuit package 105.

In the depicted embodiment, the acoustic filter 121 is an FBAR filter electrically connected to ground and/or other electronic circuitry via joints 125a and 125b (which may include solder, a combination of copper pillar and solder, or other joining technique) and respective pads 126a and 126b arranged on or in the substrate 110. The other electronic circuitry to which the acoustic filter 121 may be electrically connected may include, for example, the traces 111, 112, 113, 114, 115 and 116 interconnected by the vias 101, 102, 103 and 104, as well as the ground plane 107. It is assumed for purposes of illustration that the acoustic filter 121 is sensitive to external electromagnetic radiation, as well as internally generated electromagnetic radiation ("internal electromagnetic radiation") produced by other electronic components (e.g., the flipped chip IC 122) within the circuit package 105, which may cause electromagnetic interference, such as capacitive and inductive coupling and other cross-talk.

The flipped chip IC 122 includes a die substrate 122a with electronic circuitry 122b mounted on and/or at least partially in the die substrate 122a, generally on the side of the die substrate 122a facing toward the substrate 110 (e.g., the bottom surface, as shown in FIG. 1). Again, the electronic circuitry 122b is electrically connected to ground and/or other electronic circuitry via joints 127a and 127b (which may include solder, a combination of copper pillar and solder, or other joining technique) and respective pads 128a and 128b arranged on or in the substrate 110. An optional pillar 129 for enhancing heat dissipation from the flipped chip IC 122 is also shown. The other electronic circuitry to which the first and second electronic circuitry 121b and 122b may be electrically connected may include, for example, the traces 111, 112, 113, 114, 115 and 116 interconnected by the vias 101, 102, 103 and 104, as well as the ground plane 107.

In the depicted embodiment, the first side shield structure 141 is formed on a pad 143, or on a conductive material dispensed on the pad 143, on the substrate 110, and is located in a corresponding first side edge region 105a of the circuit package 105. The first side shield structure 141 is shown as part (approximately one half) of an electrically conductive clip (e.g., metal clip), as discussed below, that is connected to ground via the pad 143. Generally, the first side edge region 105a is a region of the circuit package 105 that begins at the outer side edge of the circuit package 105 (i.e., the left edge in the depicted example), extends inwardly, and ends before the outermost electronic component on that side, which is the acoustic filter 121 in FIG. 1. The first side edge region 105a extends inwardly far enough to include the first side shield structure 141.

Similarly, the second side shield structure 142 is formed on a pad 144 on the substrate 110, and is located in a corresponding second side edge region 105b of the circuit package 105. The second side shield structure 142 is shown to include multiple concentric or nested electrically conductive bond wires 142a, 142b and 142c extending away from the substrate 110 or the pad 144 on the substrate 110 in the corresponding second side edge region 105b. Each of the bond wires 142a, 142b and 142c is shown as part (approximately one half) of a corresponding bond wire loop, as discussed below.

The bond wires 142a and 142b are grounded via connection to the pad 144 or to a conductive material dispensed on the pad 144. However, the bond wire 142c, which contacts the external shield layer 145 in the depicted embodiment, may be connected to ground via the pad 144 and/or via the external shield layer 145. Likewise, the external shield layer 145 may be connected to ground via the bond wire 142c when they are in contact with one another. Further, in the depicted embodiment, the bond wire 142c is a flattened bond wire in that the top (apex) of the original bond wire loop (prior to singulation, as discussed below) is flattened by the external shield layer 145. This provides additional surface area for the contact between the bond wire 142c and the external shield layer 145. In alternative configurations, the bond wire 142c may contact the external shield layer 145 only at its apex, or the bond wire 142c may not contact the external shield layer 145 at all.

Of course, in various embodiments, any number of one or more bond wires may be included to provide the second side shield structure 142 (and/or the first side shield structure), without departing from the scope of the present teachings. If one or more bond wires do not contact the external shield layer 145, they are electrically grounded via the pad 144. Also, if one or more bond wires do contact the external shield layer 145, they may be connected to ground via the external shield layer 145, as mentioned above, in which case the pad 144 is not needed on the substrate 110, non-conductive material may be dispensed on the pad 144, or the pad 144 may not be connected to ground. The second side edge region 105b is a region of the circuit package 105 generally begins at the outer side edge of the circuit package 105 (i.e., the right edge in the depicted example), extends inwardly, and ends before the outermost electronic component on that side, which is the flipped chip IC 122 in FIG. 1. The second side edge region 105b extends inwardly far enough to include the second side shield structure 142.

Each of the first side shield structure 141, the second side shield structure 142, and the external shield layer 145 of the external shield 140 are formed of a conductive material (e.g., metal), such as copper (Cu), silver (Ag), gold (Au), or aluminum (Al), for example. The first side shield structure 141, the second side shield structure 142, and the external shield layer 145 may be formed of the same conductive material, or different conductive materials, without departing from the scope of the present teachings. The external shield layer 145, in particular, may be a conformal metal coat, for example, applied to the top surface of the circuit package 105 (prior to singulation) through a sputtering operation, as discussed below. In various configurations, the external shield layer 145 may also include a stainless steel (SUS) finish to improve aesthetics and enhance resistance to oxidation and other contamination. Also, the external shield layer 145 may have a thickness of about 1.0 µm to about 50 µm, for example, although other thicknesses may be incorporated without departing from the scope of the present teachings.

FIGS. 2A to 2F are simplified cross-sectional views showing an illustrative method of fabricating modules with external shields including embedded side shield structures and a top external shield layer, according to a representative embodiment.

Figure 2A:
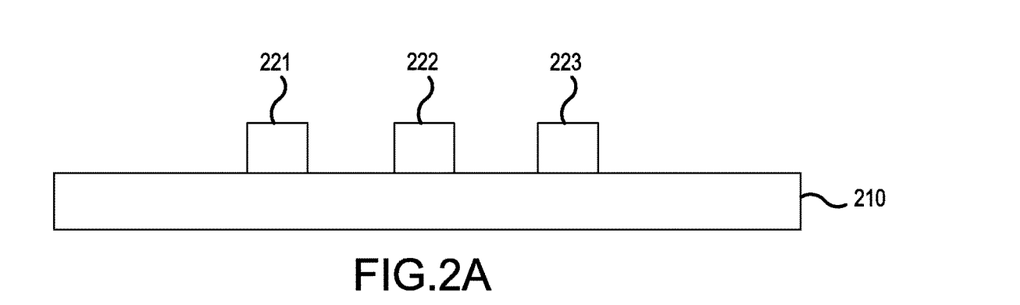
FIGS. 2A to 2F are simplified cross-sectional views showing an illustrative method of fabricating modules with internally formed side shield structures, according to a representative embodiment.

Referring to FIG. 2A, a substrate 210 is provided, and multiple circuits indicated by representative electronic components 221, 222 and 223, respectively, are assembled or formed on a substrate 210. Each circuit is shown to include just one electronic component 221, 222 or 223 merely for the sake of convenience, and that each circuit may include more than one electronic component without departing from the scope of the present teachings. The electronic components 221 to 223 may be any of a variety of types, such as acoustic filers, flipped chip ICs, and/or SMT components, for example, as discussed above. The substrate 210 may be formed of any material compatible with semiconductor processes, such as silicon (Si), gallium arsenide (GaAs), indium phosphide (InP), glass, sapphire, alumina, epoxy, bismaleimide triazine (BT), prepreg composites, reinforced or non-reinforced polymer dielectrics, and the like, for example. For purposes of illustration, it is understood that each of the electronic components 221 to 223 will correspond to a different circuit package (e.g., such as circuit package 105) after a separation process, discussed below with reference to FIG. 2E.

Figure 2B:
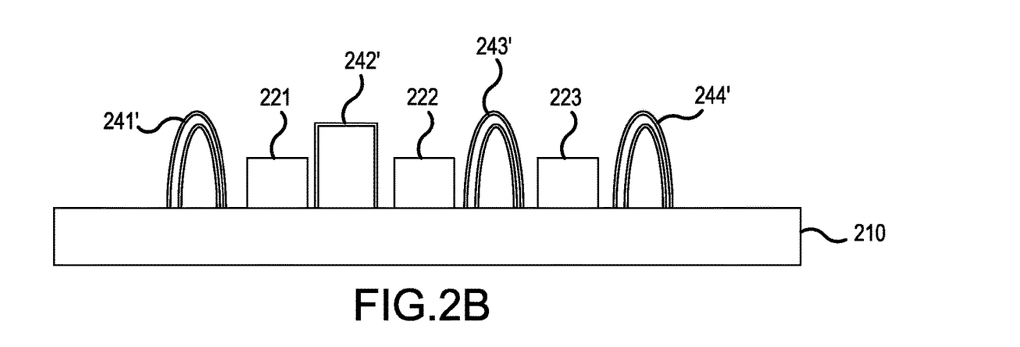

In FIG. 2B, preliminary side shield structures 241, 242, 243 and 244 are formed as loops attached to the substrate 210 (or attached to pads, or conductive material dispensed on pads, on or partially in the substrate 210, as discussed above). In the depicted embodiment, the preliminary side shield structures 241, 243 and 244 are pairs of nested bond wire loops, and the side shield structure 242 is a metal clip. However, other types of preliminary side shield structures may be incorporated, such as a single bond wire loop, a metal stud or other electrically conductive barrier that can be bisected during the separation process, as discussed below with reference to FIG. 2E. In the depicted embodiment, the preliminary side shield structure 241 is a bond wire loop pair comprising two nested bond wire loops attached adjacent to the electronic component 221, the preliminary side shield structure 242 is a metal clip attached between electronic components 221 and 222, the preliminary side shield structure 243 is a bond wire loop pair comprising two nested bond wire loops attached between electronic components 222 and 223, and the preliminary side shield structure 244 is a bond wire loop pair comprising two nested bond wire loops attached adjacent to the electronic component 223. Each of the preliminary side shield structures 241 to 243 is located in a side edge region of at least one of the circuits. Also, each of the preliminary side shield structures 241 to 243 is formed of an electrically conductive material, such as such as copper (Cu), silver (Ag), gold (Au), or aluminum (Al), for example.

Figure 2C:
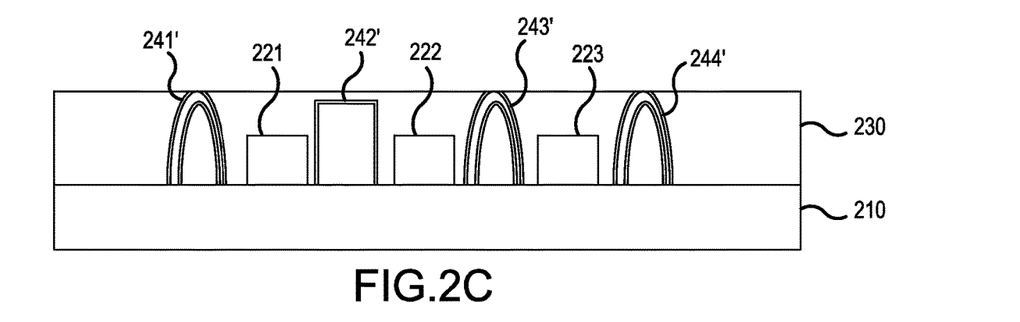

Referring to FIG. 2C, a molded compound 230 is formed on the substrate 210, the electronic components 221 to 223, and the preliminary side shield structures 241 to 244 to provide a molded substrate. In an embodiment, a mold tool (not shown) is clamped to the substrate 210 before the molded compound 230 is formed on the substrate 210. The molded compound 230 may then be formed by injecting a reinforced or non-reinforced epoxy resin, for example, into the mold tool over the substrate 210, the electronic components 221 to 223 and the preliminary side shield structures 241 to 244. An example of using a mold tool is discussed by KUMBHAT et al., U.S. patent application Ser. No. 14/920, 798, filed Oct. 22, 2015, published as 2017/0117229 on Apr. 27, 2017, which is hereby incorporated by reference in its entirety. Alternatively, the molded compound 230 may be applied by injection molding, transfer molding, or compression molding techniques, for example, although other application techniques may be incorporated without departing from the scope of the present teachings.

The molded compound 230 fills the spaces among the electronic components 221 to 223, the preliminary side shield structures 241 to 244, and the top surface of the substrate 210, encapsulating the same. Notably, when a mold tool is used, it may flatten taller side shield structures that extend above the top surface of the initial molded compound 230 (e.g., as determined by the mold tool). As mentioned above, the molded compound 230 may be formed of a reinforced or non-reinforced epoxy resin, which is applied in a liquid or viscous state, and then allowed to set to provide the solid molded compound 430. Of course, materials other than epoxy resin, such as other polymer resins and bisphenyl resins, may be provided as the molded compound 230, without departing from the scope of the present teachings.

In an embodiment, after removal of the mold tool, a top portion of the molded compound 430 may be removed to a desired height above the substrate 210, for example, by a grinding or etching operation. During the process of removing the top portion of the molded compound 230, the preliminary side shield structures 241 to 244 to provide a molded substrate may be truncated, meaning that an apex of the loop formed by one or more of the preliminary side shield structures 241 to 244 may be removed, leaving corresponding sets of single, opposing bond wires.

Figure 2D:
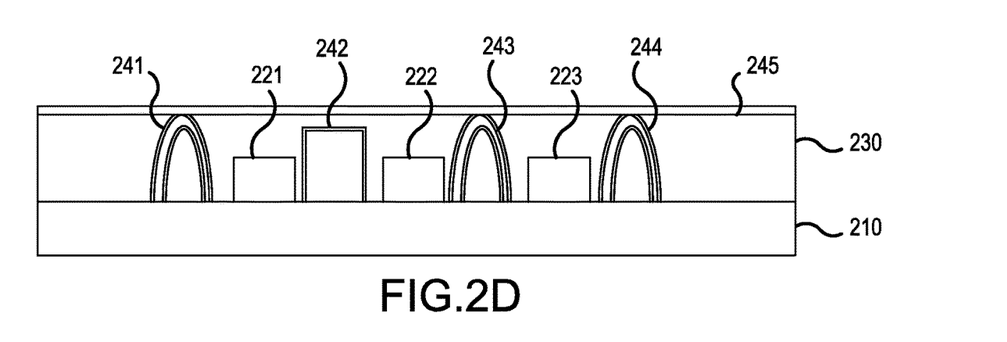

As shown in FIG. 2D, a conductive material, such as a conformal coating of metal, for example, is applied to the top surface the molded compound 230 to provide an external shield layer 245 over all of the electronic components 221 to 223 of the different circuits. As discussed above, the external shield layer 245 is formed of an electrically conductive material, such as such as copper (Cu), silver (Ag), gold (Au), or aluminum (Al), for example, applied to the top surface of the molded compound 230, e.g., by a sputtering operation, although other application techniques may be incorporated without departing from the scope of the present teachings. In various configurations, the external shield layer 245 may also include a SUS finish to improve aesthetics and enhance resistance to oxidation and other contamination.

Figure 2E:
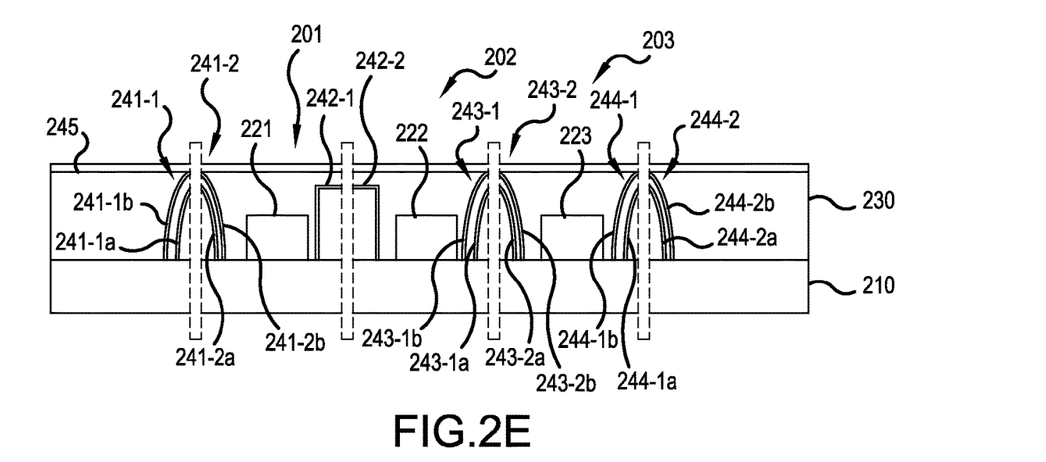

Referring to FIG. 2E, the molded substrate 210 (or wafer) is singulated into multiple modules 201, 202 and 203, which include representative electronic components 221, 222 and 223, respectively, as well as first and second side shield structures formed by bisecting the preliminary side shield structures 241 to 244, respectively, during the singulation process. The molded substrate 210 may be singulated by any process compatible with semiconductor processes, such as sawing or laser etching, for example. More particularly, the module 201 includes the electronic component 221 between first side shield structure 241-2 and second side shield structure 242-1. In the depicted embodiment, the first side shield structure 241-2 is approximately half of the preliminary side shield structure 241 (the other approximate half being side shield structure 241-1), and thus includes two nested bond wires 241-2a and 241-2b extending away from the substrate 210. The inner bond wire 241-2a would be electrically grounded via a pad (not shown) on or partially in the substrate 210, while the outer bond wire 241-2b would be electrically ground via the same pad, via a different pad (not shown) on or partially in the substrate 210, or via the external shield layer 245 (to the extent it is separately grounded). The second side shield structure 242-1 of the first module 201 is approximately half of the preliminary side shield structure 242 (the other approximate half being a first side shield structure 242-2 in the module 202), and thus includes approximately half of an electrically conductive clip, as discussed above with reference to the first side shield structure 141 in FIG. 1.

Figure 2F:
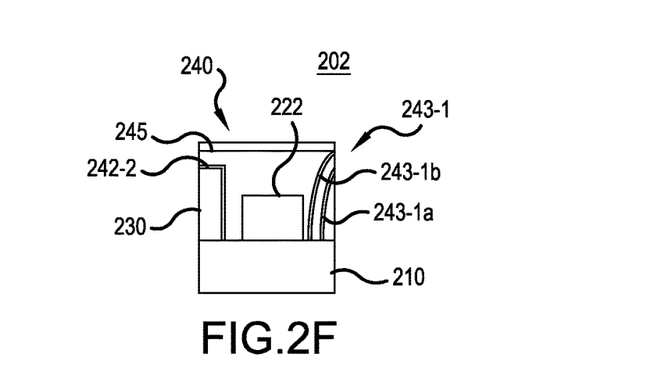

Similarly, the module 202, which is also depicted individually in FIG. 2F, includes the electronic component 222 between first side shield structure 242-2 and second side shield structure 243-1. In the depicted embodiment, the first side shield structure 242-2 is approximately half of the preliminary side shield structure 243, and thus includes approximately half of the electrically conductive clip. The second side shield structure 243-1 is approximately half of the preliminary side shield structure 243, and thus includes two nested bond wires 243-1a and 243-1b extending away from the substrate 210. The inner bond wire 243-1a would be electrically grounded via a pad (not shown) on or partially in the substrate 210, while the outer bond wire 243-1b would be electrically grounded via the same pad, via a different pad (not shown) on or partially in the substrate 210, or via the external shield layer 245 (to the extent it is separately grounded).

The module 203 includes the electronic component 223 between first side shield structure 243-2 and second side shield structure 244-1. In the depicted embodiment, the first side shield structure 243-2 is approximately half of the preliminary side shield structure 243, and thus includes two nested bond wires 243-2a and 243-2b extending away from the substrate 210. The inner bond wire 243-2a would be electrically grounded via a pad (not shown) on or partially in the substrate 210, while the outer bond wire 243-2b would be electrically grounded via the same pad, via a different pad (not shown) on or partially in the substrate 210, or via the external shield layer 245 (to the extent it is separately grounded). The second side shield structure 244-1 is approximately half of the preliminary side shield structure 244 (the other approximate half being side shield structure 244-2), and thus includes two nested bond wires 244-1a and 244-1b extending away from the substrate 210. The inner bond wire 244-1a would be electrically grounded via a pad (not shown) on or partially in the substrate 210, while the outer bond wire 243-1b would be electrically grounded via the same pad, via a different pad (not shown) on or partially in the substrate 210, or via the external shield layer 245 (to the extent it is separately grounded).

Referring to FIG. 2F, depicting the representative, singulated module 202, the first side shield structure 242-2, the second side shield structure 243-1, and the external shield layer 245 collectively provide an external shield 240 shielding at least two sides and the top surface of the circuit package in the module 202, such that the module 202 is a shielded module. The external shield 240 is configured to protect the circuit package, including the electronic component 222, from external electromagnetic radiation, as well as various environmental stresses, such as temperature and moisture.

One drawback of an external shield, such as the external shield 140 discussed above with reference to FIG. 1, shielding a circuit package from external electromagnetic radiation is that it provides no shielding of individual electronic components within the shielded module from internal electromagnetic radiation produced by other electronic components, causing electromagnetic interference, such as capacitive and inductive coupling and other cross-talk. Indeed, an external shield may aggravate the electromagnetic interference by reflecting the internal electromagnetic radiation back toward the electronic components within the circuit package. Accordingly, internal shields may be added, e.g., to the module 100, to provide shielding form internal electromagnetic radiation.

Figure 3:
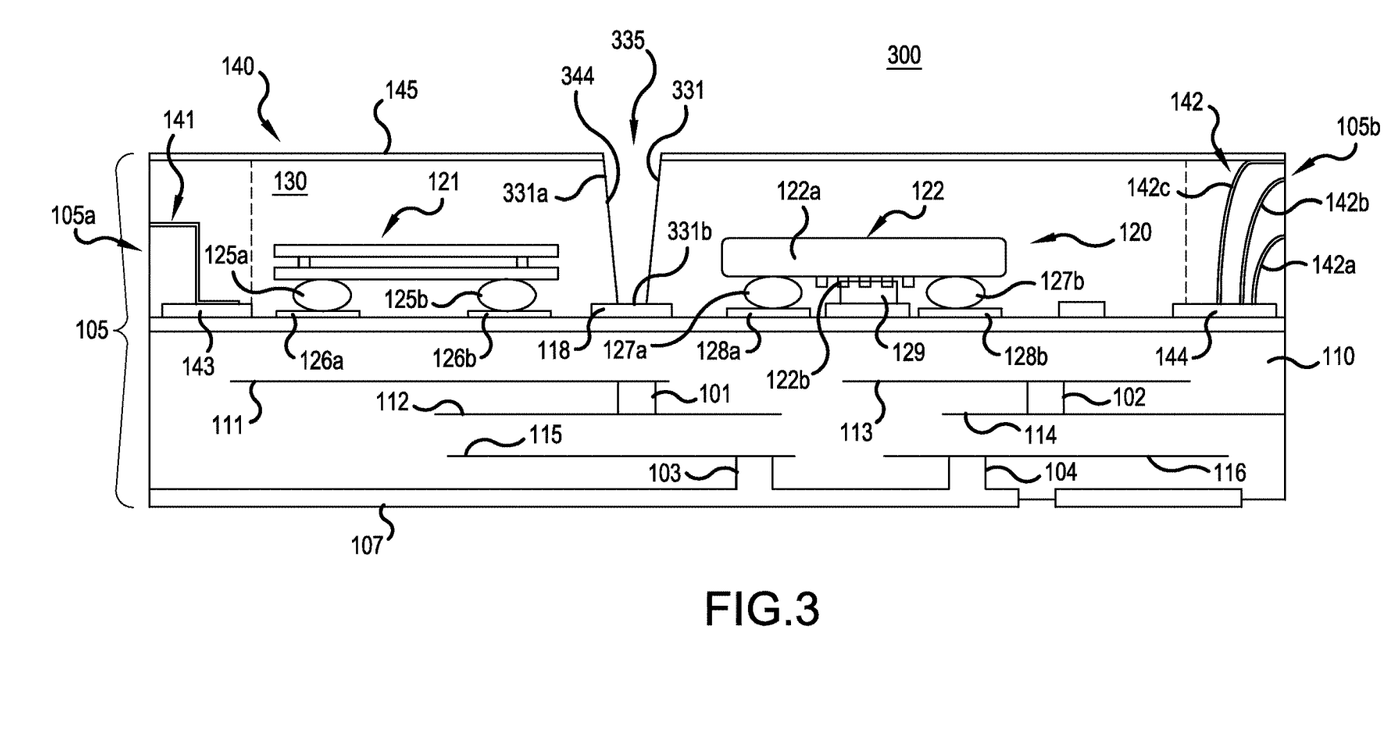
FIG. 3 is a simplified cross-sectional view of a module including internally formed side shield structures for providing external electromagnetic radiation shielding, and a trench as an internal shield, according to a representative embodiment.

FIG. 3 is a simplified cross-sectional view of a module including internally formed side shields for providing external electromagnetic radiation shielding, and a full trench as an internal shield, according to a representative embodiment.

Referring to FIG. 3, module 300 includes a circuit package 105, which includes a substrate 110, multiple electronic components 120 assembled or formed on the substrate 110, a first side shield structure 141 in a first side edge region 105a, a second side shield structure 142 in a second side edge region 105b, and molded compound 130 disposed over the substrate 110, the electronic components 120, and the first and second side shield structures 141 and 142. The module 100 further includes an external shield layer (or coating) 145 disposed on a top outer surface of the circuit package 105. The first side shield structure 141, the second side shield structure 141, and the external shield layer 145 are connected to ground, respectively, to collectively provide an external shield 140 shielding up to four sides and the top surface of the circuit package 105 from external electromagnetic radiation, environmental stress, and the like. Descriptions associated with components in the module 300 that are the same as those in module 100, as indicated by like reference numerals, will not be repeated with reference to FIG. 3 for the sake of convenience.

It is assumed, for purposes of illustration, that the electronic circuitry 122b of the flipped chip IC 122 generates a significant amount electromagnetic radiation, e.g., as compared to the acoustic filter 121, for example, thereby potentially subjecting the acoustic filter 121 to electromagnetic interference (e.g., cross-talk). Accordingly, a representative internal shield 335 in the form of a trench 331 is provided within the circuit package 105 between the flipped chip IC 122 and the acoustic filter 121. The internal shield 335 thereby reduces or eliminates electromagnetic interference and otherwise enhances isolation between the flipped chip IC 122 and the acoustic filter 121.

In the depicted embodiment, the trench 331 is a full trench in that it extends from a top surface of the molded compound 130, through the molded compound 130, to the substrate 110 or to a pad 118 formed on or at least partially in the substrate 110. An electrically conductive trench coating 344 (e.g., metal) is applied to the sidewalls 331a and the bottom 331b of the trench 331. The trench coating 344 at the bottom 331b of the trench 331 physically contacts the pad 118, forming an electrical connection to ground. Therefore, the internal shield 335 is electrically grounded. Also, in the depicted embodiment, the external shield 140 may be connected or otherwise integrated with the trench coating 344, such that the external shield 140 is also electrically grounded through the pad 118. In an alternative configuration, the external shield 140 may be grounded via the second side shield structure 142, as discussed above, in which case the pad 118 may be omitted, and thus the bottom 331b of the trench 131 physically may contact a top surface of the substrate 110. Or, the pad 118 may remain in place but is otherwise not electrically connected to ground.

Although the trench 331 is shown with sloped sidewalls 331a, it is understood that the trench 331 may have any cross-sectional shape (typically a function of the fabrication technique used to form the trench) without departing from the scope of the present teachings. Examples of various configurations of trenches to provide internal electromagnetic radiation shielding are discussed by KUMBHAT et al., U.S. patent application Ser. No. 14/920,798, filed Oct. 22, 2015, which is hereby incorporated by reference in its entirety. The trench coating 344 is formed of a conductive material (e.g., metal), such as copper (Cu), silver (Ag), gold (Au), or aluminum (Al), for example. The trench coating 344 may be formed of the same conductive material as one or more of the first side shield structure 141, the second side shield structures 142 and the external shield layer 145, or of a different conductive material, without departing from the scope of the present teachings.

Generally, the external shield 140 protects the electronic components 120 from external electromagnetic radiation and environmental stress. The internal shield 435 protects the acoustic filter 121 and the flipped chip IC 122 from internal electromagnetic radiation (e.g., generated by one or both), reducing internal electromagnetic interference and improving overall performance of the module 300.

Figure 4:
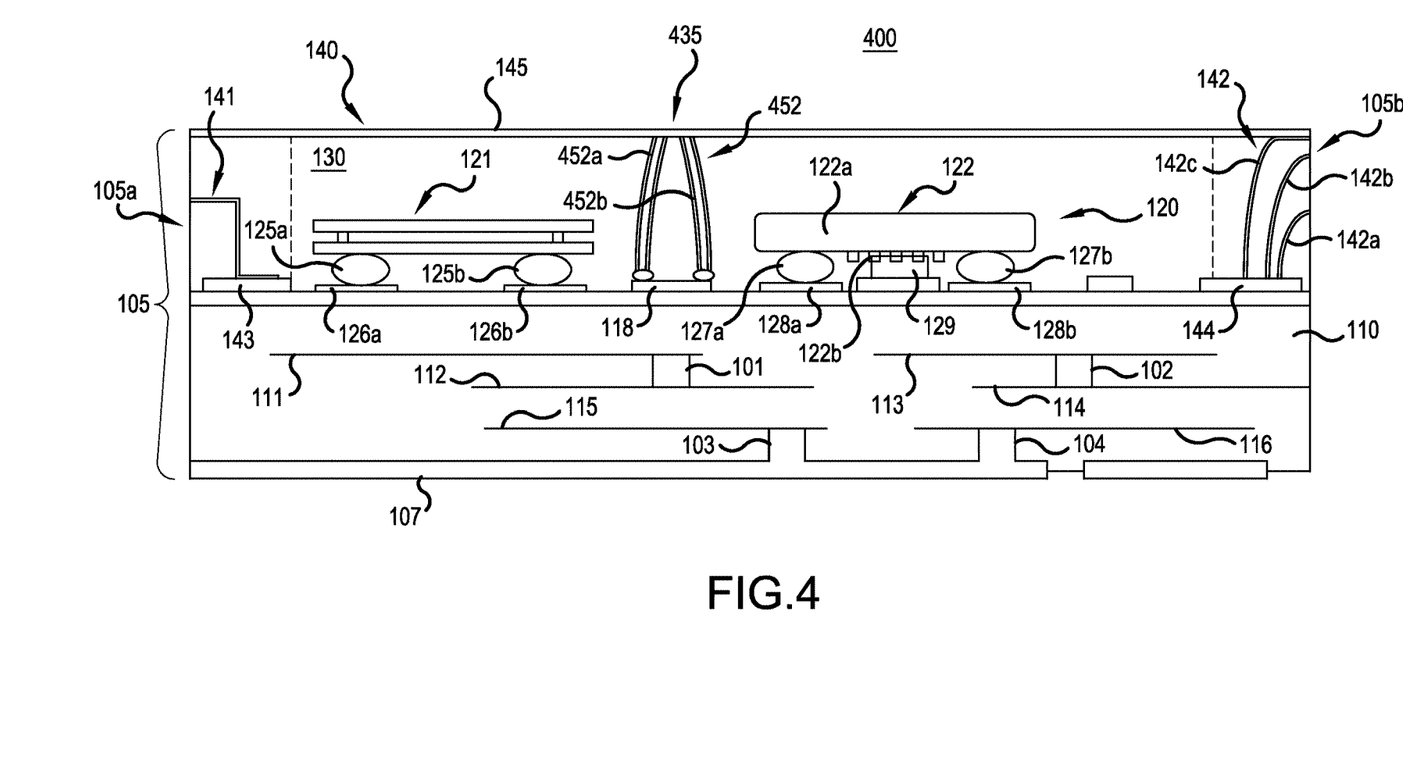
FIG. 4 is a simplified cross-sectional view of a module including internally formed side shield structures for providing external electromagnetic radiation shielding, and one or more internal bond wires as an internal shield, according to a representative embodiment.

FIG. 4 is a simplified cross-sectional view of a module including internally formed side shields for providing external electromagnetic radiation shielding, and one or more internal bond wires as an internal shield, according to a representative embodiment.

Referring to FIG. 4, module 400 includes a circuit package 105, which includes a substrate 110, multiple electronic components 120 assembled or formed on the substrate 110, a first side shield structure 141 in a first side edge region 105a, a second side shield structure 142 in a second side edge region 105b, and molded compound 130 disposed over the substrate 110, the electronic components 120, and the first and second side shield structures 141 and 142. The module 100 further includes an external shield layer (or coating) 145 disposed on a top outer surface of the circuit package 105. The first side shield structure 141, the second side shield structure 141, and the external shield layer 145 are connected to ground, respectively, to collectively provide an external shield 140 shielding up to four sides and the top surface of the circuit package 105 from external electromagnetic radiation, environmental stress, and the like. Descriptions associated with components in the module 400 that are the same as those in module 100, as indicated by like reference numerals, will not be repeated with reference to FIG. 4 for the sake of convenience.

In the depicted embodiment, the module 400 further includes a representative internal shield 435 in the form of bond wire 452 provided within the circuit package 105 between the flipped chip IC 122 and the acoustic filter 121. The internal shield 435 thereby reduces or eliminates electromagnetic interference and otherwise enhances isolation between the flipped chip IC 122 and the acoustic filter 121.

The bond wire 452 may be a truncated bond wire in that both ends of the bond wire 452 are initially connected to the pad 118 formed on or partially in the substrate 110 forming a loop. The apex of the loop is subsequently removed, as discussed above, resulting in a pair of separated bond wires 452a and 452b. Each of the separated bond wires 452a and 452b may be connected between the external shield layer 145 of the external shield 140 at one end and the pad 118 at the other end. When the pad 118 is connected to ground, the bond wires 452a and 452b, as well as the external shield layer 145, may be grounded via the pad 118. Alternatively, when the pad 118 is not connected to ground (or not in place), the bond wires 452a and 452b, as well as the external shield layer 145, may be grounded via the second side shield structure 142, as discussed above.

The grounded bond wires 452a and 452b thus form an internal shield 455 between the acoustic filter 121 and the flipped chip IC 122. The internal shield 455 blocks the internal electromagnetic radiation generated by the acoustic filter 121 and the flipped chip IC 122, resulting in reduced electromagnetic interference in the other component.

Although the bond wire 452 is shown with as a truncated bond wire with resulting separated bond wires 452a and 452b, it is understood that the bond wire 452 may have various other forms of flattened, single and/or multiple bond wires without departing from the scope of the present teachings. Examples of various configurations of one or more internal bond wires to provide internal electromagnetic radiation shielding are discussed by KUMBHAT et al., U.S. patent application Ser. No. 14/920,798, filed Oct. 22, 2015, which is hereby incorporated by reference in its entirety. The bond wires 452a and 452b are formed of a conductive material (e.g., metal), such as copper (Cu), silver (Ag), gold (Au), or aluminum (Al), for example. The bond wires 452a and 452b may be formed of the same conductive material as one or more of the first side shield structure 141, the second side shield structure 142 and the external shield layer 145, or of a different conductive material, without departing from the scope of the present teachings.

Generally, the external shield 140 protects the electronic components 120 from external electromagnetic radiation and environmental stress. The internal shield 435 protects the acoustic filter 121 and the flipped chip IC 122 from internal electromagnetic radiation (e.g., generated by one or both), reducing internal electromagnetic interference and improving overall performance of the module 400.

Figure 5:
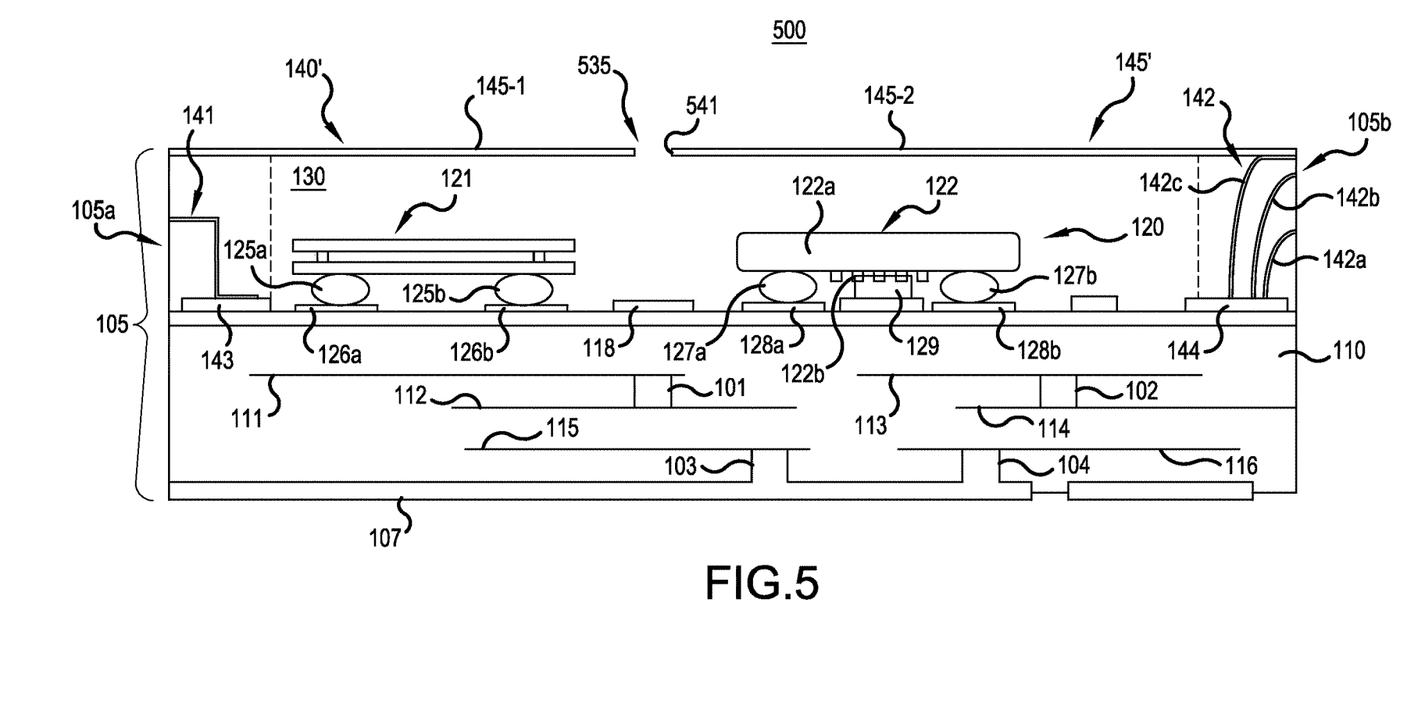
FIG. 5 is a simplified cross-sectional view of a module including internally formed side shield structures for providing external electromagnetic radiation shielding, and a partitioned external shield separated by a gap acting as internal shield, according to a representative embodiment.

FIG. 5 is a simplified cross-sectional view of a module including internally formed side shields for providing external electromagnetic radiation shielding, and a partitioned external shield separated by a gap acting as internal shield, according to a representative embodiment.

Referring to FIG. 5, module 500 includes a circuit package 105, which includes a substrate 110, multiple electronic components 120 assembled or formed on the substrate 110, a first side shield structure 141 in a first side edge region 105a, a second side shield structure 142 in a second side edge region 105b, and molded compound 130 disposed over the substrate 110, the electronic components 120, and the first and second side shield structures 141 and 142. The module 500 further includes an external shield layer (or coating) 145' disposed on a top outer surface of the circuit package 105. The first side shield structure 141, the second side shield structure 141, and the external shield layer 145' are connected to ground, respectively, to collectively provide an external shield 140' shielding up to four sides and the top surface of the circuit package 105 from external electromagnetic radiation, environmental stress, and the like. Descriptions associated with components in the module 500 that are the same as those in module 100, as indicated by like reference numerals, will not be repeated with reference to FIG. 5 for the sake of convenience.

In the depicted embodiment, the module 500 further includes a representative internal shield 535 in the form of a gap 541 in the external shield layer 145' of the external shield 140, cutting the external shield layer 145' into shield partitions 145-1 and 145-2, for example, to form the internal shield 535. The shield partitions 145-1 and 145-2 may be separately grounded, such that the internal shield 535 at the gap 541 reduces or eliminates electromagnetic interference and otherwise enhances isolation between the flipped chip IC 122 and the acoustic filter 121. The external shield 140' is configured to protect the circuit package 105 (and the electronic components 120 within the circuit package 105) from external electromagnetic radiation, environmental stress, and the like.

In the depicted embodiment, the gap 541 is formed in the external shield layer 145' between adjacent electronic components 120, respectively. That is, the gap 541 is disposed between the acoustic filter 121 and the flipped chip IC 122. The gap 541 may formed by any technique compatible with semiconductor fabrication processes, such as plasma etching, laser cutting, mechanical sawing, or the like. The representative shield partitions 145-1 and 145-2 defined by the gap 541 may be any shape or size. Also, the gap 541 may be through the full thickness of the external shield layer 145', as shown, or only partially through the thickness of the external shield layer 145', without departing from the scope of the present teachings.

In various embodiments, the shield partitions 145-1 and 145-2 may be separately grounded. For example, in the depicted configuration, the shield partition 145-2 is grounded through the second side shield structure 142, indicated by the bond wire 142c connected to the pad 144, which is connected to ground. The shield partition 145-1 may be grounded through a bond wire (not shown), similar to the bond wire 452 described above with reference to FIG. 4. Alternatively, in an embodiment in which the first side shield structure 141 extends far enough to contact the shield partition 145-1, then the shield partition 145-1 may be grounded through the first side shield structure 141 and the pad 143, which is connected to ground. Of course, the separate grounding may be accomplished through other means, such as via a trench, as discussed above with reference to FIG. 3, for example, without departing from the scope of the present teachings. Each of the shield partitions 145-1 and 145-2 is formed of a conductive material, such as metal, compatible with semiconductor processes, such as copper (Cu), gold (Au), silver (Ag), or aluminum (Al), for example, and may be formed of the same or different materials as the first and second side shields 141 and 142, as discussed above with regard to the external shield layer 145, without departing from the scope of the present teachings.

The gap 541 creates an internal shield 535 between the acoustic filter 121 and the flipped chip IC 122. More particularly, the presence of the gap 541 enables at least a portion of the internal electromagnetic radiation generated by the acoustic filter 121 and/or the flipped chip IC 122 to exit the module 500, as opposed to being reflected inwardly by the external shield 140', reducing the amount of internal electromagnetic radiation in the general vicinity of the gap 541 (that is, between the adjacent electronic components 120. The internal shield 535 therefore reduces and/or at least partially blocks the internal electromagnetic interference between the acoustic filter 121 and the flipped chip IC 122. Examples of various configurations of partitioned external shields to provide internal electromagnetic radiation shielding are discussed by KUMBHAT et al., U.S. patent application Ser. No. 14/920,798, filed Oct. 22, 2015, which is hereby incorporated by reference in its entirety.

Generally, the external shield 140' protects the electronic components 120 from external electromagnetic radiation and environmental stress. The internal shield 535 protects the acoustic filter 121 and the flipped chip IC 122 from internal electromagnetic radiation (e.g., generated by one or both), reducing internal electromagnetic interference and improving overall performance of the module 500.

The various components, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

What is claimed:

1. A module, comprising:
a circuit package, comprising:
a plurality of electronic components on a substrate;
at least one side shield structure located at a corresponding at least one side edge region of the circuit package and electrically connected to ground, the at least one side shield structure being positioned on the substrate or on a pad on the substrate; and
a molded compound disposed over the substrate, the plurality of electronic components, and the at least one side shield structure, such that each of the at least one side shield structure is partially embedded in the molded compound and has an exposed end uncovered by the molded compound at a side edge of the corresponding at least one side edge region of the circuit package; and
a top external shield layer disposed on a top outer surface of the circuit package and electrically connected to ground,
wherein the at least one side shield structure and the top external shield layer provide an external shield configured to protect the circuit package from external electromagnetic radiation and environmental stress, and
wherein the at least one side shield structure extends partially through the molded compound without contacting the top external shield layer.

2. The module of claim 1, wherein the external shield provided by the at least one side shield structure and the top external shield layer is further configured to simultaneously provide protection to other circuit packages from electromagnetic radiation emitted by the circuit package of the module.

3. The module of claim 1, wherein the at least one side shield structure comprises at least one bond wire extending away from the substrate or the pad on the substrate in the corresponding at least one side edge region.

4. The module of claim 3, wherein top external shield layer is grounded via a bond wire, other than the at least one bond wire of the at least one side shield structure, contacting the top external shield layer.

5. The module of claim 1, wherein the at least one side shield structure comprises a metal clip extending away from the substrate or the pad on the substrate in the corresponding at least one side edge region.

6. The module of claim 1, wherein the at least one side shield structure comprises a metal stud extending away from the substrate or the pad on the substrate in the corresponding at least one side edge region.

7. The module of claim 1, wherein the at least one side shield structure provides a corresponding portion of the external shield after application of the molded compound and the top external shield layer to the substrate, initially containing a plurality of circuit packages, which are singulated to provide the module, and exposing the exposed end of the at least one side shield structure at the corresponding at least one side edge region of the circuit package.

8. A module, comprising:
a circuit package, comprising:
an electronic component on a substrate;
side shield structures located at corresponding side edge regions of the circuit package and electrically connected to ground, the side shield structures being positioned on the substrate or on a pad on the substrate; and
a molded compound disposed over the substrate, the electronic component and the side shield structures, each of the side shield structures having an exposed end, uncovered by the molded compound at a side edge of the corresponding side edge region of the circuit package, from bisection of each of the side shield structures during separation from other circuit packages; and
a top external shield layer disposed on a top outer surface of the circuit package,
wherein the side shield structures and the top external shield layer collectively provide an external shield configured to protect the circuit package from external electromagnetic radiation and environmental stress, the exposed ends of the side shield structures being exposed below the top external shield layer, avoiding contact between the top external shield layer and the side shield structures.

9. The module of claim 8, wherein at least one of the side shield structures comprises a bisected bond wire extending away from the substrate or the pad on the substrate in the corresponding side edge region.

10. The module of claim 8, wherein at least one of the side shield structures comprises a bisected metal clip extending away from the substrate or the pad on the substrate in the corresponding side edge region.

\* \* \* \* \*